United States Patent [19]
Shibata

[11] Patent Number: 5,192,908
[45] Date of Patent: Mar. 9, 1993

[54] SEMICONDUCTOR DEVICE TESTING APPARATUS WITH POSITIONING MECHANISM

[75] Inventor: Junichirou Shibata, Urawa, Japan

[73] Assignee: Tokyo Electron Limited, Tokyo, Japan

[21] Appl. No.: 814,787

[22] Filed: Dec. 31, 1991

[30] Foreign Application Priority Data

Jan. 16, 1991 [JP] Japan .................................. 3-3317

[51] Int. Cl.$^5$ ........................................... G01R 31/02
[52] U.S. Cl. ............................. 324/158 F; 324/158 P
[58] Field of Search ............... 324/158 P, 158 F, 72.5; 269/55, 66, 21; 33/645

[56] References Cited

U.S. PATENT DOCUMENTS

| | | | |
|---|---|---|---|
| 3,936,743 | 2/1976 | Roch ................................ | 324/158 F |
| 4,066,943 | 1/1978 | Roch ................................ | 324/158 F |
| 4,758,785 | 7/1988 | Rath ................................ | 324/158 F |
| 4,955,590 | 9/1990 | Narushima et al. ................ | 269/21 |
| 5,010,296 | 4/1991 | Okada et al. ..................... | 324/158 F |
| 5,042,421 | 8/1991 | Anbe . | |

Primary Examiner—Vinh Nguyen
Attorney, Agent, or Firm—Oblon, Spivak, McClelland, Maier & Neustadt

[57] ABSTRACT

An apparatus for bringing probe pins of a probe head into contact with electrode terminals of an IC chip to test electrical characteristics of the device is provided. This apparatus includes a test table supported on an X-Y stage. Four chucking positions are formed on a support surface of the test table. Guide plates for positioning two adjacent sides of the IC chip are arranged at each chucking position. A vacuum pad for chucking and fixing the lower surface of the IC chip is arranged at each chucking position. IC chips are respectively placed near the four chucking positions on the support surface. The test table is linearly moved, and the IC chips are slid on the support surface by the inertia force, so that the two sides of each IC chip respectively abut against the corresponding guide plates. The IC chips are simultaneously positioned at the chucking positions, respectively. The IC chips are fixed at the chucking positions by the vacuum pads, respectively. The test table is then moved to a reference test position, and the IC chips are tested using the probe head.

14 Claims, 7 Drawing Sheets

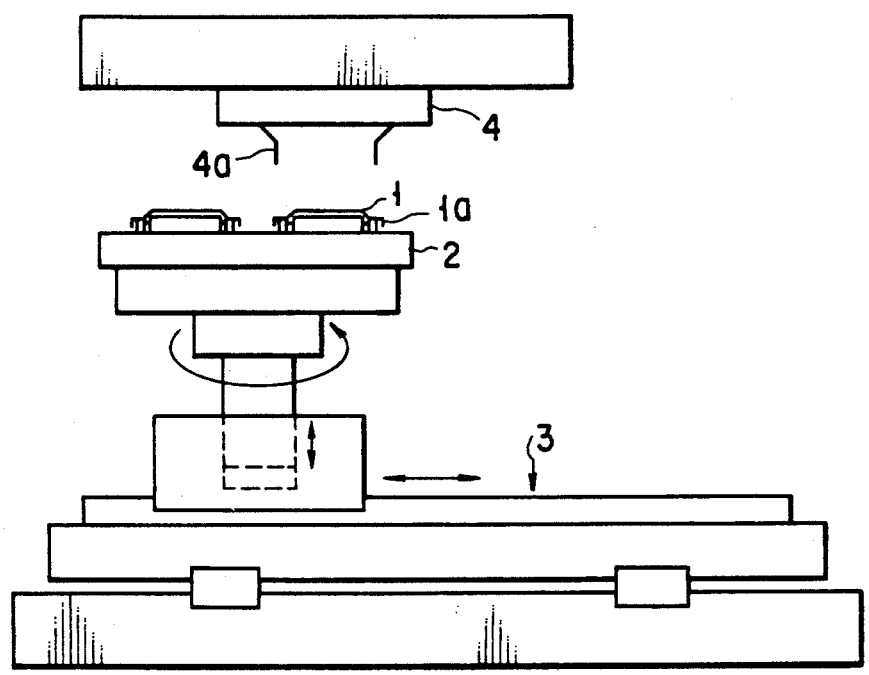
F I G. 1

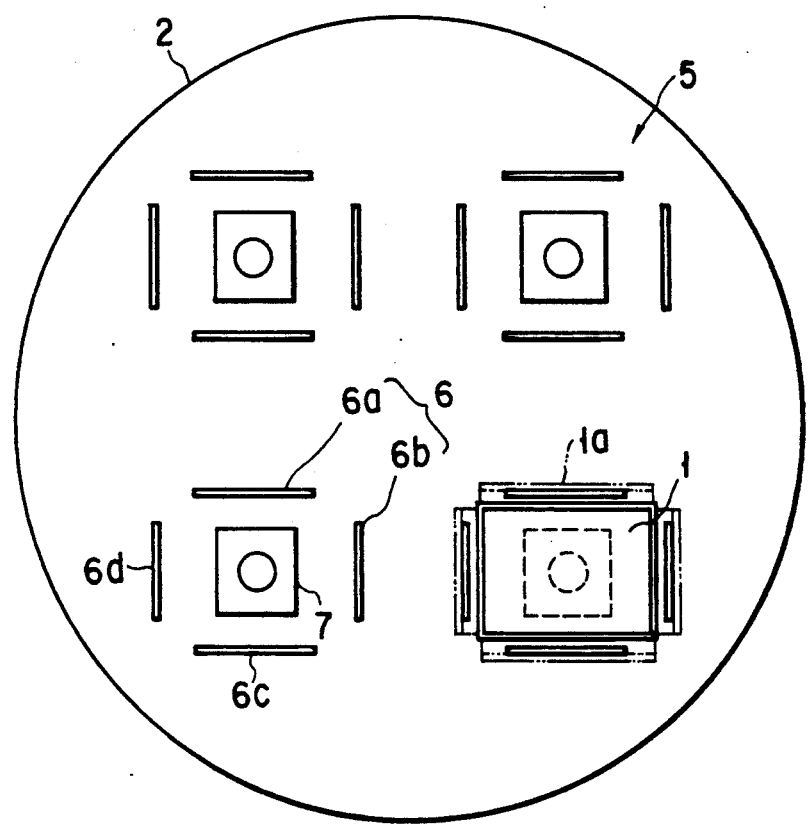
F I G. 2
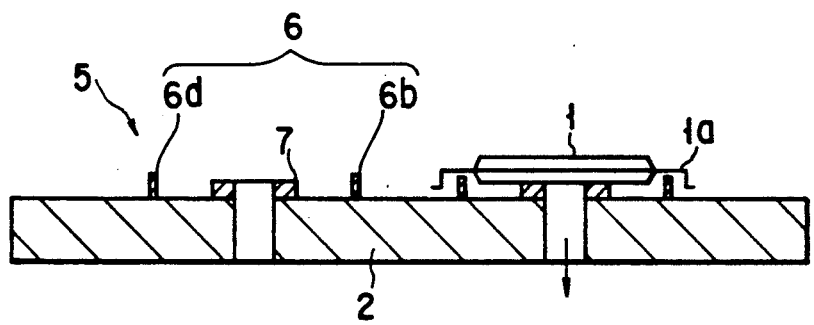
F I G. 3

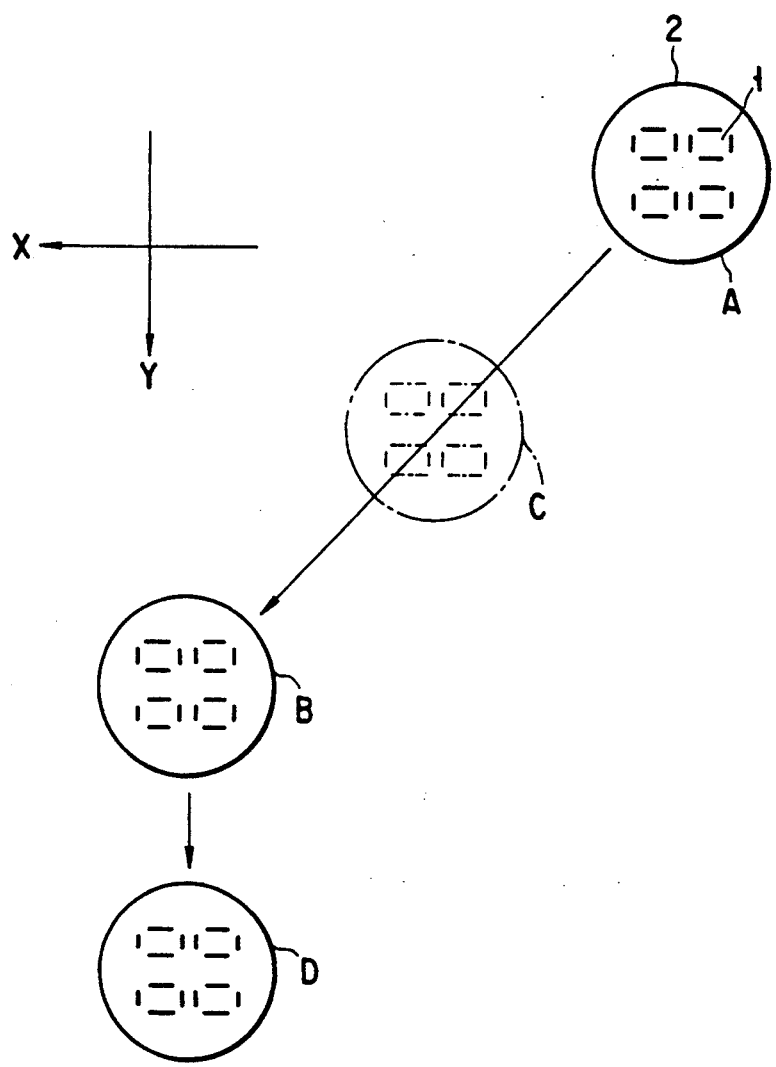
F I G. 4

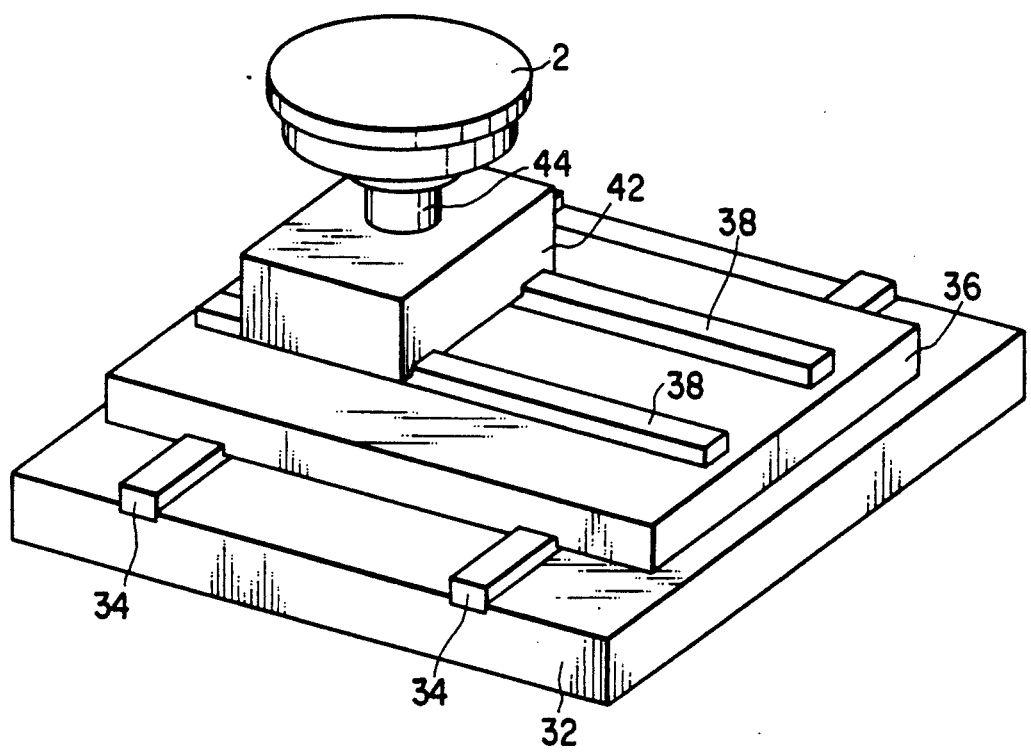
F I G. 8

SEMICONDUCTOR DEVICE TESTING APPARATUS WITH POSITIONING MECHANISM

BACKGROUND OF THE INVENTION

1. Field of the Invention

The present invention relates to an apparatus for testing a semiconductor device and, more particularly, to positioning of a packed semiconductor device in a test apparatus 2. Description of the Related Art In a process for testing various electrical characteristics of a packed semiconductor device (to be referred to as an IC chip hereinafter), an IC chip as a target test object is inserted into a socket manufactured in correspondence with electrode terminals of the IC chip, thereby electrically connecting the IC chip to a tester. In recent years, however, even in the IC chip test process, demand has arisen for increasing the throughput. Therefore, a testing method is used, in which the IC chip is electrically connected to the tester through test terminals called probe pins.

As described above, in electrical connection of an IC chip through probe pins, in order to increase test precision, it is important to align the probe pins with electrode terminals of the IC chip with high precision. In addition, along with an increase in integration density of semiconductor devices, IC chips tend to have a large number of terminals and a small pitch between adjacent terminals. When such an IC chip is to be tested, highly precise positioning is required As this highly precise positioning method, electrode terminals of an IC chip placed on a test table are graphically recognized using, e.g., a camera, and positioning is performed on the basis of this image information.

In the positioning method which employs the image recognition technique described above, however, the operation time including an image recognition time is prolonged. In addition, since image recognition must be performed for each of the IC chips, a long positioning time is required and test efficiency of IC chips is degraded, resulting in inconvenience. Although test efficiency of IC chips is intended to be improved using probe pins, a test efficiency improvement effect using the probe pins cannot be sufficiently enhanced. Further, when the positioning method using image recognition is applied, the apparatus itself becomes expensive, and degradation of versatility may be caused.

Under these circumstances, strong demand has arisen for developing a relatively inexpensive test apparatus for semiconductor devices, which is capable of performing high-precision, high-speed positioning in order to accurately test IC chips at high speed.

SUMMARY OF THE INVENTION

The present invention has been made to solve the conventional problems described above, and has as its object to provide a method and apparatus for testing a semiconductor device with high test precision at a high apparatus throughput and a low apparatus cost.

According to the first aspect of the present invention, there is provided a test apparatus for a semiconductor device having first and second adjacent sides which form an angle therebetween, comprising:

testing means arranged at a test position;

a test table having a support surface for the semiconductor device, the test table having a reference position for testing the semiconductor device by the testing means and having a chucking position of the semiconductor device on the support surface;

a first guide plate disposed on the test table so as to abut against the first side of the semiconductor device placed at the chucking position;

a second guide plate disposed on the test table so as to abut against the second side of the semiconductor device placed at the chucking position;

fixing means, arranged on the test table, for fixing the semiconductor device placed at the chucking position; and driving means for accelerating and moving the test table within a plane parallel to the support surface, the driving means sliding the semiconductor device on the support surface by an inertia force during movement of the test table and positioning the semiconductor device at the chucking position by causing the first and second sides of the semiconductor element to abut against the first and second guide plates, respectively.

According to the second aspect of the present invention, there is provided a testing method using the test apparatus of the first aspect, comprising the steps of:

placing the semiconductor device on the support surface;

causing the driving means to move the test table so as to slide the semiconductor device on the support surface by the inertia force during movement, and causing the first and second sides of the semiconductor device to abut against the first and second guide plates, respectively, thereby positioning the semiconductor device at the chucking position;

causing the fixing means to fix the semiconductor device at the chucking position during the movement of the test table after the first and second sides of the semiconductor device abut against the first and second guide plates, respectively, but before the test table is decelerated;

positioning the test table at the reference position; and testing the semiconductor device using the testing means.

In the test apparatus according to the present invention, when the test table is moved while the semiconductor device is kept placed on the test table, the semiconductor device can be urged against the guide plates by the inertia force. The semiconductor device is thus positioned by the guide plates located at the predetermined positions. While the test table is moved and the semiconductor device is kept positioned, the semiconductor device is fixed, thereby accurate positioning is performed at high speed.

In the test apparatus according to the present invention, high-precision positioning of a plurality of semiconductor devices can be simultaneously performed at high speed. Test precision can be improved, and the apparatus throughput can be increased. In addition, since no special positioning mechanism is required, an inexpensive apparatus can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic view showing an arrangement of a semiconductor test apparatus according to an embodiment of the present invention;

FIG. 2 is a plan view of a test table used in the semiconductor test apparatus shown in FIG. 1;

FIG. 3 is a seotional side view of the test table shown in FIG. 2,

FIG. 4 is a view showing movement positions of the test table in positioning of the semiconductor device in a test method according to an embodiment of the present invention;

FIG. 8 is a perspective view showing a movable stage in the apparatus shown in FIG. 1;

DETAILED DESCRIPTION OF THE PREFERRED EMBODIMENTS

Figure 5:
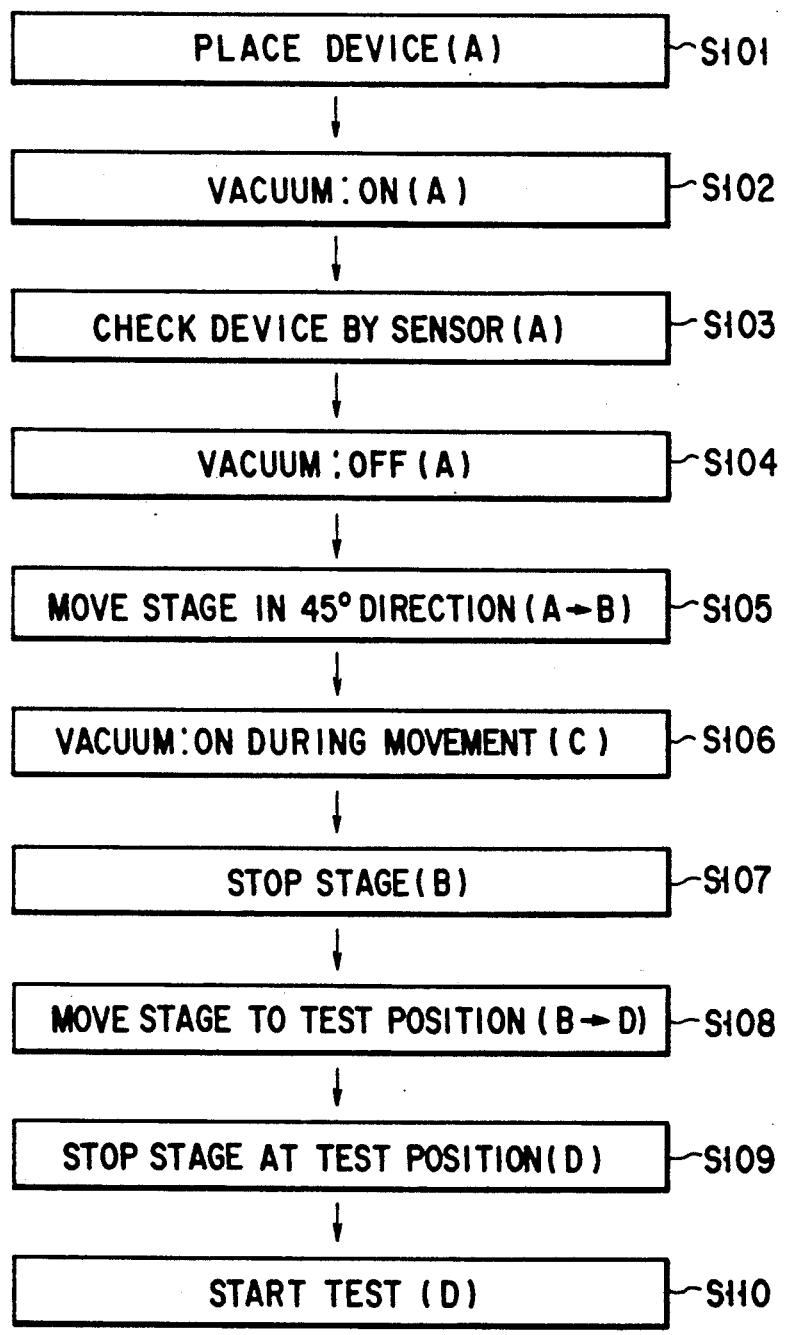
FIG. 5 is a flow chart showing a semiconductor device test process together with the movement positions of FIG. 4 according to the test method of the present invention.

Preferred embodiments of the present invention will be described with reference to the accompanying drawings.

As shown in FIG. 1, a semiconductor test apparatus of this embodiment has a test table 2 for supporting and holding a semiconductor device serving as a test object, e.g., a rectangular flat package semiconductor device or IC chip 1. The test table 2 is placed on a stage 3 movable in the X-Y plane and is vertically movable and rotatable. The test table 2 is movable in the X-Y-Z-$\theta$ directions, in which movement of the test table 2 between the load/unload position and the test position of the IC chip 1 is performed in the X-Y plane.

As shown in FIG. 8, the stage 3 comprises first to third bases 32, 36, and 42. A pair of rails 34 are installed on the first base 32, and the second base 36 is supported on the rails 34 to be movable in the Y direction. A pair of rails 38 are installed on the second base 36, and the third base 42 is supported on the rails 38 to be movable in the X direction. A shaft 44 is arranged on the third base 42 to be vertically movable (Z direction) and rotatable ($\theta$ direction). The test table 2 is fixed on an upper portion of the shaft 44. A probe head 4 having test terminals such as probe pins 4a is arranged at a predetermined position above the test table 2. The probe pins 4a are arranged in accordance with the layout of electrode terminals 1a of the IC chip 1 as a target object. The probe head 4 is connected to a test head (not shown), and various electrical characteristics of the IC chip 1 are tested.

As shown in FIGS. 2 and 3, the test table 2 has a plurality (four) of chip holders 5. Each chip holder 5 has a guide 6 corresponding to the shape of the IC chip 1. This guide 6 has an internal size slightly larger than the outer size of the IC chip 1 and is constituted by four guide plates 6a to 6d respectively corresponding to the four sides of the IC chip 1. In this embodiment, the guide plates 6a and 6b of the four guide plates 6a to 6d define a chucking position for testing the IC chip 1.

A fixing means such as a vacuum pad 7 is formed inside the guide 6 of each chip holder 5. A vacuum suction mechanism (not shown) is connected to the vacuum pad 7 to chuck and hold the IC chip 1. The vacuum pad 7 is made of, for example, stainless steel, and its upper surface is finished with a mirror surface. By this mirror surface finishing, when the IC chip 1 is to be chucked, no gap is formed between the lower surface of the IC chip 1 and the upper surface of the vacuum pad. At the same time, sliding movement of the IC chip 1 on the vacuum pad 7 is facilitated.

An operation of the semiconductor test apparatus having the above arrangement will be described with reference to FIGS. 4 and 5.

The stage 3 is driven to move the test table 2 to the load/unload position (a position A) of the IC chip 1. Each IC chip 1 is moved to a corresponding chip holder 5 on the test table 2 (step S101). The vacuum suction mechanism is temporarily operated at this position, and each IC chip 1 is chucked and held (S102). Mounting of the IC chip 1 on each chip holder 5 is checked by a sensor (not shown) (S103).

The test table 2 is moved from the load/unload position (the position A) to the test position (a position D) below the probe head 4. The following chip positioning is performed in this movement process.

That is, suction and holding of each IC chip 1 is released (S104). The test table 2 is moved (from the position A to a position B) in a negative direction with respect to a virtual corner constituted by the two adjacent guide plates 6a and 6b of the four guide plates 6a to 6d (S105). This direction roughly corresponds to a 45° direction (line y=x) in the X-Y plane of the stage 3.

Figure 6:
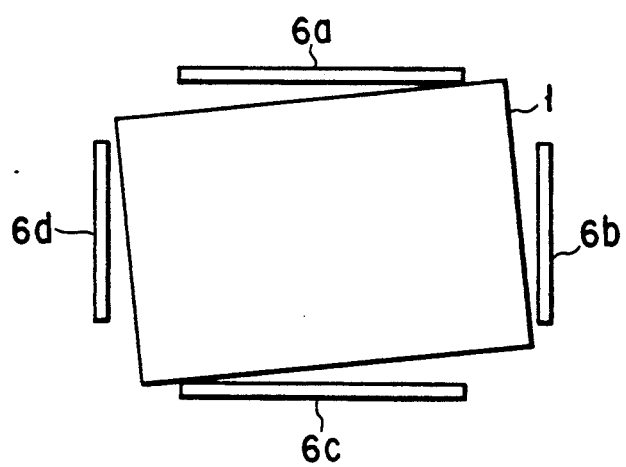
FIG. 6 is a view showing one semiconductor device before positioning is performed in the test method of the present invention.
Figure 7:
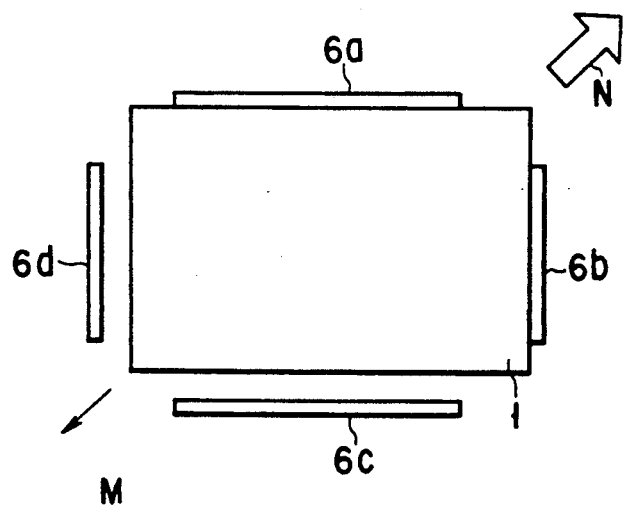
FIG. 7 is a view showing one semiconductor device after positioning is performed in the test method of the present invention.

When the IC chips 1 are initially mounted on the test table 2, the IC chips 1 are simply stored in the guides 6, respectively. Therefore, as shown in FIG. 6, the IC chips 1 are mounted at arbitrary positions within the guides 6, respectively. When the test table 2 is moved in the 45° direction (i.e., a direction indicated by an arrow M) at a predetermined speed, e.g., 0.1 m/sec to 1 m/sec while the IC chips 1 are simply placed (i.e., suction and holding are released), the IC chips 1 are slid on the corresponding vacuum pads 7 by an inertia force. Each IC chip 1 is urged by the inertia force (i.e., the direction indicated by an arrow N) against the guide plates 6a and 6b which are located in a direction opposite to the movement direction and which form a right angle. Since in this state the two sides of each IC chip 1 are urged against the guide plates 6a and 6b defining the chucking position, the IC chip 1 is positioned at the chucking position, as shown in FIG. 7.

After each IC chip 1 is moved by a distance enough to perform the above positioning operation by the inertia force, the vacuum suction mechanism is operated during the movement (a position C), and the IC chip 1 is chucked and held by the corresponding vacuum pad 7 (S106). Positioning of each IC chip 1 is completed by the chucking and holding operations of the IC chip.

Suction of the IC chip 1 in step S106 can be performed during acceleration or during constant-speed movement after the acceleration as long as it is before the test table 2 is decelerated. The IC chip 1 is preferably chucked during acceleration of the test table 2 because the IC chip 1 is firmly kept urged against the two guide plates 6a and 6b in this period.

The stage 3 is then temporarily stopped (S107) and the test table 2 is moved to a predetermined test position (i.e., from the position B to the position D) (S108). When the test table 2 reaches the test position (the position D), the stage 3 is stopped (S109). The test table 2 is moved upward at the position D, and the probe pins 4a of the probe head 4 are brought into contact with the corresponding electrode terminals 1a of the IC chip 1, and a predetermined test is performed (S110). The plurality of IC chips 1 are sequentially tested by lifting the test table 2 each time the test table 2 is moved.

Figure 9:
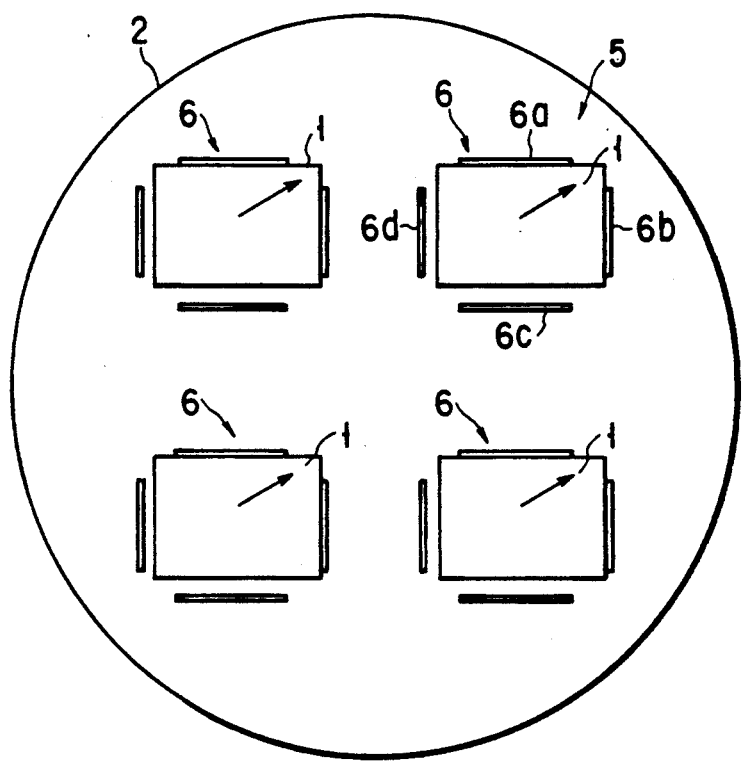
FIG. 9 is a plan view showing a test table as a whole after positioning according to the test method of the present invention.

In the semiconductor test apparatus of this embodiment, since the IC chip 1 is positioned such that the IC chip 1 is urged against the guide plates 6a and 6b by utilizing the inertia force generated by movement of the test table 2, a special positioning unit need not be arranged to perform high-speed positioning. Since positioning is performed using the inertia force, positioning can be simultaneously performed for the plurality of chip holders 5 arranged on the test table 2, as shown in FIG. 9. Therefore, the plurality of IC chips 1 can be accurately positioned with an inexpensive, simple arrangement, and the apparatus throughput can be increased with high testing precision.

In the above embodiment, the test table 2 is linearly moved substantially in a 45° direction to urge the IC chip 1 against the two guide plates 6a and 6b, thereby achieving positioning of the IC chip 1. However, the present invention is not limited to this. The moving direction of the IC chip is determined to generate vector components of a force for urging two sides of the IC chip against two guide plates. In an extreme case, the moving direction may be a 10° or 80° direction in the X-Y coordinate system of the stage 3.

Further, it is possible to generate vector components of a force for urging two sides of the IC chip against two guide plates by rotating the test table 2 clockwise or counterclockwise by 45° from the position A shown in FIG. 4, and then moving the test table 2 in the X or Y direction.

Figure 10:
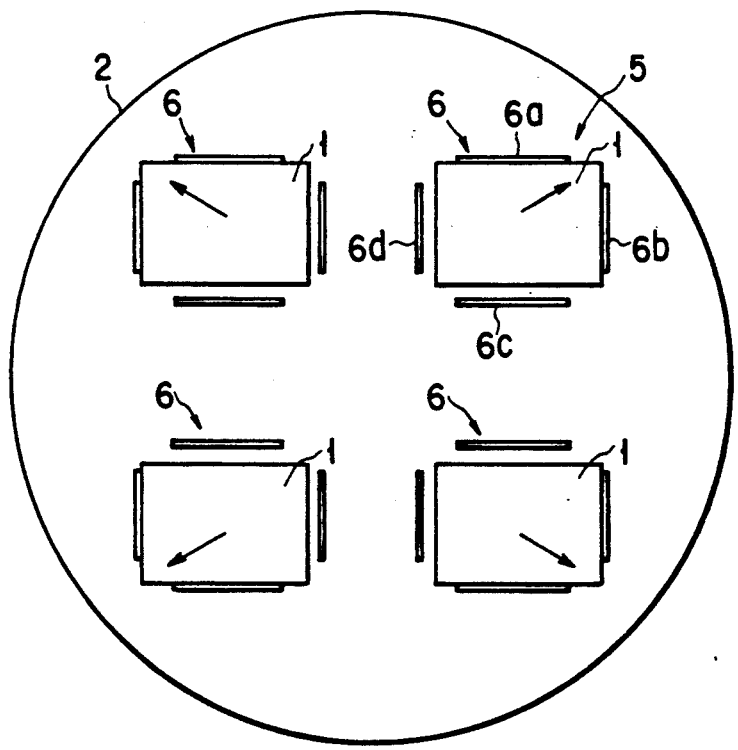
FIG. 10 is a plan view showing a test table as a whole after positioning in a test method according to another embodiment of the present invention.

According to the present invention, the IC chip 1 can be positioned utilizing only rotation ($\theta$ direction) of the test table 2. In this case, as shown in FIG. 10, simultaneous positioning can be performed while the four IC chips 1 are urged against two outer guide plates by a centrifugal force.

A test method according to the present invention is not limited to a type in which probe pins are brought into contact with the electrode terminals of an IC chip. For example, the present invention is applicable to a test method of a type in which after an IC chip is positioned, the outer appearance of the chip is inspected using a camera.

A target test object according to the present invention is not limited to a packed IC chip. If a semiconductor device has two adjacent sides which form an angle and which can be utilized for positioning the semiconductor device, for example, a chip before packaging can be used as a target test object.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A test apparatus for a semiconductor device having first and second adjacent sides which form an angle therebetween, comprising:
    a test table having a support surface on which a setting position of the semiconductor device to be tested is formed;
    testing means for testing the semiconductor device placed at the setting position;
    a first guide provided on the test table so as to abut against the first side of the semiconductor device placed at the setting position;
    a second guide provided on the test table so as to abut against the second side of the semiconductor device placed at the setting position;
    fixing means, arranged on the test table, for fixing the semiconductor device placed at the setting position; and
    driving means for moving the test table from a first position where the semiconductor device is placed on the support surface to a second position where the semiconductor device is tested by the testing means, and for linearly accelerating and moving the test table on a plane parallel to the support surface so as to generate vector components of a force for urging the first and second sides of the semiconductor device against the first and second guides, respectively;
    wherein the semiconductor device on the support surface is slid by an inertia force during acceleration of the test table and is positioned at the setting position by causing the first and second sides thereof to abut against the first and second guides, respectively.

2. An apparatus according to claim 1, wherein said fixing means includes a vacuum suction member, arranged on said support surface, for chucking a lower surface of the semiconductor device.

3. An apparatus according to claim 1, wherein the semiconductor device includes a plurality of electrode terminals, and said testing means includes a probe head having a plurality of probe pins brought into contact with the electrode terminals to test electrical characteristics of the semiconductor device.

4. An apparatus according to claim 1, wherein an angle formed between the first and second guides is substantially a right angle.

5. An apparatus according to claim 4, wherein the driving means drives the test table in first and second directions perpendicular to each other, and the first and second guides extend along the first and second directions, respectively.

6. An apparatus according to claim 1, wherein a plurality of semiconductor device setting positions are formed on the support surface and each is provided with first and second guides and fixing means.

7. A testing method using a test apparatus for a semiconductor device having first and second adjacent sides which form an angle therebetween;
    the test apparatus comprising:

a test table having a support surface on which a setting position of the semiconductor device to be tested is formed;

testing means for testing the semiconductor device placed at the setting position;

a first guide provided on the test table so as to abut against the first side of the semiconductor device placed at the setting position;

a second guide provided on the test table so as to abut against the second side of the semiconductor device placed at the setting position;

fixing means, arranged on the test table, for fixing the semiconductor device placed at the setting position; and driving means for moving the test table from a first position where the semiconductor device is placed on the support surface to a second position where the semiconductor device is tested by the testing means, and for linearly accelerating and moving the test table on a plane parallel to the support surface so as to generate vector components of a force for urging the first and second sides of the semiconductor device against the first and second guides, respectively;

the testing method comprising the steps of:

placing the semiconductor device on the support surface of the test table positioned at the first position;

causing the driving means to move the test table from the first position toward the second position;

accelerating the test table by the driving means during the movement of the test table so as to allow the semiconductor device to be slid by an inertia force and to be positioned at the setting position by causing the first and second sides thereof to abut against the first and second guides, respectively;

fixing the semiconductor device at the setting position by the fixing means during the movement of the test table after the first and second sides of the semiconductor device abut against the first and second guides, respectively, but before the test table is decelerated;

positioning the test table at the second position; and testing the semiconductor device by use of the testing means.

8. A method according to claim 7, wherein the step of causing said fixing means to fix the semiconductor device comprises causing said fixing means to fix the semiconductor device during accelerator of said test table.

9. A method according to claim 7, further including the step of checking the presence of the semiconductor device after the semiconductor device is placed and before said test table is moved.

10. A method according to claim 7, wherein the step of causing said fixing means to fix the semiconductor device comprises vacuum-chucking and fixing a lower surface of the semiconductor device.

11. A method according to claim 7, wherein the semiconductor device has a plurality of electrode terminals, said testing means includes a probe head having a plurality of probe pins brought into contact with said electrode terminals, and the step of testing the semiconductor device comprises bringing said probe pins into contact with the electrode terminals and testing electrical characteristics of the semiconductor device.

12. A method according to claim 7, wherein an angle formed between the first and second guides is substantially a right angle.

13. A method according to claim 12, wherein the driving means drives the test table in first and second directions perpendicular to each other, and the first and second guides extend along the first and second directions, respectively.

14. A method according to claim 7, wherein a plurality of semiconductor device setting positions are formed on the support surface and each is provided with first and second guides and fixing means, whereby a plurality of semicondcutor devices are positioned at respective setting positions at a same time.

* * * * *